(12) United States Patent
Suzuki et al.

(10) Patent No.: US 7,307,312 B2
(45) Date of Patent: Dec. 11, 2007

(54) METHOD OF MANUFACTURING A SEMICONDUCTOR DEVICE

(75) Inventors: Mikimasa Suzuki, Toyohashi (JP); Yoshiyuki Hattori, Aichi-gun (JP); Kyoko Nakashima, Nagoya (JP)

(73) Assignee: DENSO CORPORATION, Kariya (JP)

( * ) Notice: Subject to any disclaimer, the term of this patent is extended or adjusted under 35 U.S.C. 154(b) by 160 days.

(21) Appl. No.: 10/817,904

(22) Filed: Apr. 6, 2004

(65) Prior Publication Data

US 2004/0238882 A1 Dec. 2, 2004

(30) Foreign Application Priority Data

May 30, 2003 (JP) ............................. 2003-155451

(51) Int. Cl.
*H01L 21/8238* (2006.01)
*H01L 29/94* (2006.01)

(52) U.S. Cl. ...................... 257/330; 257/328; 257/329; 257/E21.599; 257/E29.257

(58) Field of Classification Search ................ 257/330, 257/328, 329; 438/212, 259
See application file for complete search history.

(56) References Cited

U.S. PATENT DOCUMENTS

| | | | |
|---|---|---|---|
| 5,216,275 A | 6/1993 | Chen | |
| 6,040,600 A | 3/2000 | Uenishi et al. | |
| 6,337,498 B1 * | 1/2002 | Hasegawa et al. | 257/328 |
| 6,406,982 B2 | 6/2002 | Urakami et al. | |
| 6,743,703 B2 * | 6/2004 | Rodov et al. | 438/527 |
| 6,836,001 B2 * | 12/2004 | Yamauchi et al. | 257/627 |
| 2001/0016369 A1 * | 8/2001 | Zandman et al. | 438/106 |
| 2001/0028083 A1 | 10/2001 | Onishi et al. | |
| 2001/0032998 A1 * | 10/2001 | Iwamoto et al. | 257/330 |
| 2002/0027237 A1 * | 3/2002 | Onishi et al. | 257/262 |
| 2002/0088990 A1 | 7/2002 | Iwamoto et al. | |
| 2003/0038342 A1 * | 2/2003 | Standing | 257/584 |
| 2003/0219933 A1 * | 11/2003 | Yamauchi et al. | 438/156 |
| 2004/0016959 A1 | 1/2004 | Yamaguchi et al. | |
| 2004/0084724 A1 * | 5/2004 | Kapels et al. | 257/330 |
| 2004/0235272 A1 * | 11/2004 | Howard et al. | 438/462 |
| 2005/0006717 A1 | 1/2005 | Yamaguchi et al. | |

(Continued)

FOREIGN PATENT DOCUMENTS

JP 2000-260984 9/2000

(Continued)

OTHER PUBLICATIONS

Xing-Bi Chen et al., "Optimization of the Specific On-Resistance of the Coolmos™", IEEE Transactions on Electron Devices, vol. 48 No. 2 Feb. 2001, pp. 344-348.

(Continued)

*Primary Examiner*—A. Sefer
(74) *Attorney, Agent, or Firm*—Posz Law Group, PLC

(57) ABSTRACT

A semiconductor device manufacturing method comprises forming a pn column so that the pn column is designed to have a strip form in the section of the substrate and have a repetitive pattern of a p-conduction type and an n-conduction type on the substrate surface over an area where plural semiconductor devices having the same structure are formed in a semiconductor substrate, forming residual constituent elements of the plural semiconductor devices having the same structure in areas where the repetitive patterns are located while the pn column serves as a part of the constituent element of each semiconductor device, and dicing the individual semiconductor devices into chips from the area where the plural semiconductor devices having the same structure are formed.

18 Claims, 13 Drawing Sheets

U.S. PATENT DOCUMENTS

| | | | |
|---|---|---|---|
| 2005/0045874 A1* | 3/2005 | Xiao et al. | 257/40 |
| 2005/0045996 A1* | 3/2005 | Yamauchi et al. | 257/627 |
| 2005/0077572 A1* | 4/2005 | Yamauchi et al. | 257/341 |
| 2005/0133859 A1* | 6/2005 | Kuwahara et al. | 257/328 |

FOREIGN PATENT DOCUMENTS

| | | | |
|---|---|---|---|
| JP | 2001-127289 | * | 5/2001 |
| JP | 2003-209123 | * | 7/2003 |

OTHER PUBLICATIONS

Second Office Action from Chinese Patent Office issued on Apr. 13, 2007 for the corresponding Chinese patent application No. 2004100472390 (a copy and English translation thereof).

First Office Action from Chinese Patent Office issued on Oct. 13, 2006 for the corresponding Chinese patent application No. 2004100472390 (a copy and English translation thereof).

* cited by examiner

FIG. 1A
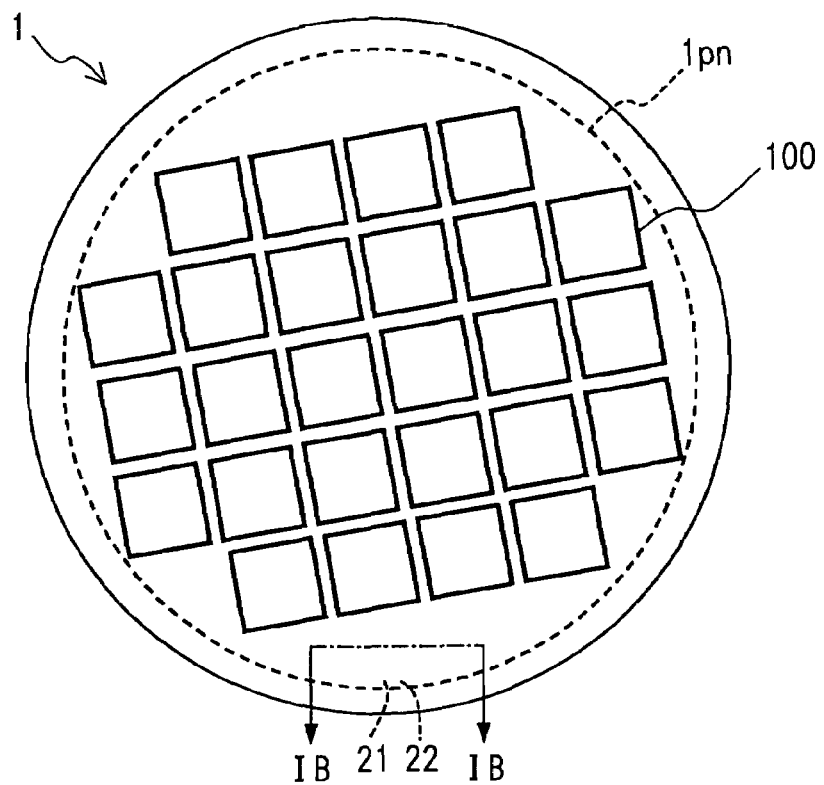
FIG. 1B
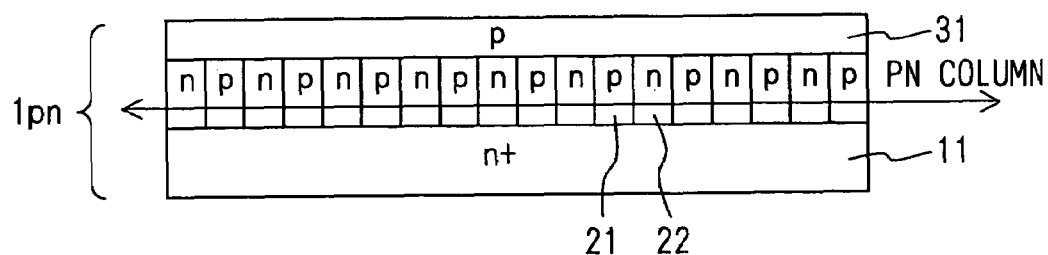
FIG. 1C
FIG. 1D
FIG. 1E
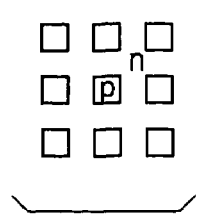 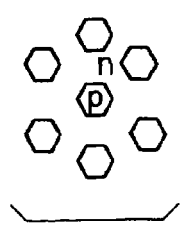 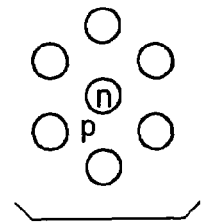

PN COLUMN (SJ STRUCTURE)

METHOD OF MANUFACTURING A SEMICONDUCTOR DEVICE

CROSS REFERENCE TO RELATED APPLICATION

This application is based upon, claims the benefit of priority of, and incorporates by reference the contents of Japanese Patent Application No. 2003-155451 filed on May 30, 2003.

FIELD OF THE INVENTION

The present invention relates to a semiconductor device having a super junction (SJ) structure formed of a pn column and a method of manufacturing thereof.

BACKGROUND OF THE INVENTION

In the field of semiconductor devices used for power application, a vertical type MOSFET having a super junction (SJ) structure which can be designed to have a high withstanding voltage and a low ON-resistance is disclosed in JP-A-2002-184985 (Patent Document 1) and JP-A-2000-260984 (Patent Document 2), for example.

FIG. 12 is a perspective view schematically showing a vertical type MOSFET 90 having an SJ structure disclosed in the Patent Document 1. In the vertical type MOSFET 90 formed in a semiconductor substrate 1, a pn column formed portion comprising a repetitive pattern of a p-conduction type region 21 and an n-conduction type region 22 on an $n^+$-conduction type layer 11 serving as a drain corresponds to an SJ structure. Particularly, FIG. 12 shows one end portion of the vertical type MOSFET 90, and a repetitive pattern of a stripe-shaped p-conduction type region 21 and a stripe-shaped n-type conduction region 22 and a repetitive pattern of a stripe-shaped source S and a stripe-shaped gate G are arranged in the rightward direction of FIG. 12. Furthermore, the left side of FIG. 12 shows the end portion of the vertical type MOSFET 90, and an n-conduction type region 23 having a larger width than the n-conduction type regions 22 of the pn column is formed so as to extend to the surface of the semiconductor substrate 1.

In FIG. 12, reference numeral 31 represents a p-conduction type layer serving as a body layer, reference numeral 32 represents a p-conduction type region serving as a channel, and reference numeral 33 represents an n-conduction type region serving as a source. Furthermore, reference numeral 41 represents a gate oxide film formed in a trench, and reference numeral 42 represents a trench gate electrode. Each striped trench gate electrode 42 is disposed in parallel to the striped pn column so as to project into the n-conduction type region 22 of the pn column. Reference numeral 10 represents an alignment key for the positioning between the trench gate electrode 42 and the n-conduction type region 22.

In the vertical MOSFEfT 90 having the SJ structure of FIG. 12, electrons flowing out from the n-conduction type region 33 serving as the source pass through the channel formed in the p-conduction type region 32 and the p-conduction type layer 31 around the trench gate electrode 42 and flow into the n-conduction type region 22 of the pn column which serves as a drift region. Accordingly, the concentration of impurities in the n-conduction type region 22 serving as the drift region can be increased, and the ON-resistance of the vertical type MOSFET 90 of FIG. 12 can be lowered. On the other hand, under an OFF-state, the pn column is completely depleted so that the withstanding voltage can be increased. As described above, a vertical type MOSFET having desired ON-resistance and withstanding voltage can be achieved by properly setting the width, depth and impurity-concentration of the pn column.

FIG. 13 shows another example of the vertical type MOSFET having the SJ structure and is a perspective view schematically showing the vertical MOSFET 91 disclosed in the Patent Document 2. In the vertical type MOSFET 91 shown in FIG. 13, the similar parts to the respective constituent elements of the vertical type MOSFET 90 of FIG. 12 are represented by the same reference numerals.

The vertical type MOSFET 91 of FIG. 13 is different from the vertical type MOSFET 90 of FIG. 12 in that an $n^-$-conduction type layer 37 is added to the pn column. Furthermore, in the vertical type MOSFET 91 of FIG. 13, the repetitive pattern of the striped p-conduction type regions 21 and the striped n-conduction type regions 22 constituting the pn column and each trench gate electrode 42 are disposed to cross each other. The tip of each trench gate electrode 42 is located within the $n^-$-conduction type layer 37, and does not project into the pn column.

In the vertical type MOSFET 91 having the SJ structure of FIG. 13, electrons flowing out from the n-conduction type regions 33 serving as the sources pass through channels formed in the p-conduction type regions 32 around the trench gate electrodes 42, and then flow into the $n^-$-conduction type layer 37 serving as the drift region. and the n-conduction type region 22 of the pn column. and the n-conduction type region 22 of the pn column.

FIGS. 14A to 14D and FIGS. 15A to 15C are cross-sectional views showing a method of manufacturing the vertical type MOSFET 90 shown in FIG. 12. The cross-sectional views of FIGS. 14A to 15C show the flow of the manufacturing process of the vertical type MOSFET 90 when viewed from the front side in the perspective view of FIG. 12.

In the manufacturing process of the vertical type MOSFET 90, a semiconductor substrate (wafer) 1 in which an n-conduction type layer 20 is formed on an $n^+$-conduction type layer 11 is prepared, and then trenches 20t are first formed in the semiconductor substrate 1 as shown in FIG. 14A, whereby the n-conduction type layer 20 is divided into n-conduction type regions 22 constituting a pn column and a wide n-conduction type region 23 at the end portion. In this trench forming step, an alignment key 10 comprising shallow trenches is also formed in advance.

Subsequently, p-conduction type layers are formed to be embedded in the trenches 20t as shown in FIG. 14B by an epitaxial method, and then the surface of the semiconductor substrate thus formed is flattened. Accordingly, the p-conduction type layers embedded in the trenches 20t serve as p-conduction type regions 21, whereby the pn column is completed. The pn column thus formed serves as an SJ (Super Junction) structure. During the formation of the p-conduction type layers, the alignment key 10 is masked.

Subsequently, a p-conduction type layer 31 serving as a body layer is further formed on the semiconductor substrate 1 by the epitaxial method as shown in FIG. 14C.

Subsequently, as shown in FIG. 14D, ion-implantation of n-type impurities is applied to the p-conduction type layer 31 on the wide n-conduction type region 23 at the end portion so that the wide n-conduction type region 23 at the end portion reaches the upper surface of the semiconductor substrate 1.

Subsequently, as shown in FIG. 15A, a predetermined area of the p-conduction type layer 31 is masked, and ion implantation of impurities is selectively carried out to form p-conduction type regions 32 serving as channels and n-conduction type regions 33 serving as sources.

Subsequently, as shown in FIG. 15B, alignment (positioning) is carried out by using the alignment key 10 so that the stripes of the trenches to be formed are located within the n-conduction type regions 22 of the pn column, whereby the trenches projecting into the pn column at the tips thereof are formed. Thereafter, the trench side walls are oxidized to form gate oxide film 41, and gate electrodes 42 are filled in the trenches.

Finally, as shown in FIG. 15C, a source electrode 6 is formed through interlayer insulating film 5, and a drain electrode 7 is formed on the opposite side to the source electrode 6, thereby completing the formation of the vertical type MOSFET 90 shown in FIG. 12.

In the manufacturing process of the semiconductor device, a plurality of semiconductor devices having the same structure are normally formed on one semiconductor substrate (wafer), and then cut out into individual chips, whereby the plural semiconductor devices are formed from one semiconductor substrate (wafer). In the above manufacturing process, many vertical MOSFETs 90 having the same structure shown in FIG. 12 are likewise formed in one semiconductor substrate (wafer) 1, and finally cut out into individual chips, thereby manufacturing plural vertical MOSFETs 90 of FIG. 12.

In the manufacturing process shown in FIGS. 14A to FIG. 15C, the trench gate electrodes 42 are formed to be in alignment with the n-conduction type regions 22 of the pn column. Accordingly, the step of forming the alignment key 10 and the step of masking the alignment key 10 are needed as shown in FIGS. 14A and 14B. In the trench forming step for the gate electrodes of FIG. 15B, the mask for forming the trenches for the gate electrodes is needed to be aligned with the alignment key 10. Therefore, the manufacturing cost is increased by the steps relevant to the alignment.

On the other hand, the vertical type MOSFET 91 of FIG. 13 does not need the alignment of the trench gate electrodes 42 with the pn column because the n⁻-conduction type layer 37 is additionally formed on the pn column. However, in this case, it is needed to form the n⁻-conduction layer 37, so that the manufacturing cost is also increased.

SUMMARY OF THE INVENTION

Therefore, the present invention has an object to provide a semiconductor device manufacturing method and a semiconductor substrate with which in a process of manufacturing a semiconductor device having pn columns and having a high withstanding voltage and low ON-resistance, no addition layer is formed and alignment with pn columns is eliminated to thereby reduce the manufacturing cost, and a low-price semiconductor device which can be manufactured by using the semiconductor substrate according to the semiconductor device manufacturing method described above.

In order to attain the above object, according to a first aspect of the present invention, there is provided a semiconductor device manufacturing method for forming a plurality of semiconductor devices having the same structure in one semiconductor substrate and cutting out the semiconductor devices into individual chips to manufacture a plurality of semiconductor devices, characterized by comprising: a pn column forming step of forming a pn column so that the pn column is designed to have a strip form in the section of the substrate and have a repetitive pattern of a p-conduction type and an n-conduction type on the substrate surface over an area where plural semiconductor devices having the same structure are formed in the semiconductor substrate; a semiconductor device forming step of forming residual constituent elements of the plural semiconductor devices having the same structure in areas where the repetitive patterns are located while the pn column serves as a part of the constituent element of each semiconductor device; and a semiconductor device cut-out step of cutting out the individual semiconductor devices into chips from the area where the plural semiconductor devices having the same structure are formed.

According to the semiconductor device manufacturing method according to the first aspect, an alignment step for the pn column can be eliminated, so that the manufacturing cost of the semiconductor device can be reduced. Furthermore, the plural semiconductor devices having the same structure are formed in the areas where the repetitive pattern of the pn column is located, and cut out into chips, thereby manufacturing the individual semiconductor devices. Accordingly, each of the semiconductor devices thus cut out as a chip can be produced as a semiconductor device having a pn column over the whole surface of the chip and containing the pn column concerned as a part of the constituent element thereof.

According to second to fourth aspects, there is provided semiconductor substrate used to manufacture the semiconductor device described above.

According to the second aspect of the present invention, in a semiconductor substrate used in the semiconductor device manufacturing method for forming a plurality of semiconductor substrates having the same structure in one semiconductor substrate and cutting out the semiconductor substrates thus formed into individual chips to thereby manufacture the plural semiconductor devices, a pn column is formed over the whole area where the plural semiconductor devices having the same structure are formed so that the pn column has a strip form in the section of the substrate and also has a repetitive pattern of a p-conduction type and an n-conduction type on the substrate surface.

By using the semiconductor substrate described above, plural semiconductor devices having the same structure are formed in the area where the repetitive pattern of the pn column is located while the alignment with the pn column is not carried out, and they are cut out into individual chips, whereby the individual semiconductor devices can be manufactured. Accordingly, the manufacturing cost of the semiconductor devices can be reduced by eliminating the alignment step. Furthermore, each of the semiconductor devices thus cut out as a chip can be used as a semiconductor device that has a pn column formed over the whole surface of the chip and contains the pn column concerned as a part of the constituent element thereof.

According to the third and fourth aspects, the repetitive pattern in the semiconductor substrate is preferably a striped pattern or a symmetrical dot pattern. With these patterns, a plurality of semiconductor devices each of which has a pn column as a super junction (SJ) structure and also has a high with standing voltage and low ON-resistance can be manufactured from the semiconductor substrate described above without carrying out alignment with the pn column.

According to fifth to sixteenth aspects of the present invention, there is provided a semiconductor device manufactured by using the semiconductor device manufacturing device and the semiconductor substrate described above.

According to the fifth aspect of the present invention, there is provided a semiconductor device achieved by forming a plurality of semiconductor devices having the same structure in one semiconductor substrate and cutting out the semiconductor devices into individual chips, characterized by comprising: a pn column having a strip form in the section of the substrate and a repetitive pattern of a p-conduction type and an n-conduction type on the substrate surface, the pn column serving as a part of the constituent element of the semiconductor device; and the residual part of the constituent element of the semiconductor device which is formed in an area where the repetitive pattern of the pn column is located, the individual semiconductor devices being cut out into chips from the area where the plural semiconductor devices having the same structure are formed.

According to the fifth aspect, a plurality of semiconductor devices described above can be formed in one semiconductor substrate without carrying out alignment with the pn column, and thus the semiconductor devices can be manufactured at low cost. Furthermore, the plural semiconductor devices formed in the area where the repetitive pattern of the pn column is located are cut out into chips, thereby forming individual semiconductor devices. Accordingly, each semiconductor device has a pn column formed over the whole surface of the chip thereof.

The semiconductor device of the sixth aspect is characterized in that the repetitive pattern is a striped pattern. Furthermore, the semiconductor device of the seventh aspect is characterized in that the repetitive pattern is a symmetrical dot pattern. As described above, even when the pn column has any one of the striped pattern and the symmetrical dot pattern, the super junction (SJ) structure can be designed to have a high withstanding voltage and low ON-resistance.

According to the eighth and ninth aspects of the present invention, the semiconductor device of the present invention is suitably applied to a vertical type MOSFET or IGBT having a pn column as a super junction. Accordingly, a vertical type MOSFET or IGBT having a high withstanding voltage and low ON-resistance can be manufactured at low cost.

According to tenth, thirteenth and fourteenth aspects of the present invention, the gate structure of the vertical type MOSFET or IGBT may be a trench gate structure, a planar gate structure or a concave gate structure. With these gate electrode structures, a vertical MOSFET or IGBT having a high withstanding voltage and low ON-resistance can be manufactured with no alignment work.

According to the eleventh aspect of the present invention, in the case of the trench gate structure, trench gates are formed so as to project into the pn column, whereby a vertical type MOSFET or IGBT having a high withstanding voltage and low ON-resistance can be manufactured at low cost.

Furthermore, according to the twelfth aspect of the present invention, when the array of the trench gates and the repetitive pattern are designed in a stripe form, the stripe of the trench gate array and the stripe of the repetitive pattern are disposed to cross each other, whereby a vertical type MOSFET or IGBT having a high withstanding voltage and low ON-resistance can be manufactured without carrying out precise alignment with the pn column.

According to a fifteenth aspect of the present invention, the semiconductor device is suitably applied to a diode in which a pn column is used as a pn junction. With this structure, a diode having a high withstanding voltage and low ON-resistance can be manufactured at low cost.

According to a sixteenth aspect of the present invention, the semiconductor device of this invention has an equipotential ring surrounding the semiconductor device on the pn column, wherein the ring width of the equipotential ring is set to be larger than the repetitive width of the repetitive pattern.

The width of the equipotential ring (EQR) is set to be larger than the repetitive width of the repetitive pattern, so that an equipotential ring effective to enhance the reliability of the semiconductor device can be formed with no precision alignment.

BRIEF DESCRIPTION OF THE DRAWINGS

FIG. 1A is a plan view showing a semiconductor substrate used to manufacture a semiconductor device according to the present invention, FIG. 1B is a cross-sectional view taken along a line IB-IB of FIG. 1A, and FIGS. 1C to 1E show symmetrical dot patterns in which the repetitive pattern of a pn column is symmetrical;

FIGS. 5A to 5C show a simulation result of a withstanding characteristic under an off-state of the vertical type MOSFET, wherein FIG. 5A is a cross-sectional view showing a simulation model, FIG. 5B is a diagram showing an equipotential diagram when a withstanding voltage to dielectric breakdown in the cross-section of FIG. 5A is applied, and FIG. 5C is a graph showing the current-voltage characteristic;

FIGS. 6A to 6B are cross-sectional views showing a simulation result of the withstanding voltage characteristic under the off-state of the vertical type MOSFET, wherein FIG. 6A is a cross-sectional view showing a simulation model, FIG. 6B is a diagram showing an equipotential diagram when a withstanding voltage to dielectric breakdown in the cross-sectional of FIG. 6A is applied.

FIGS. 7A to 7C show a simulation result of the withstanding voltage characteristic under the off-state of the vertical type MOSFET, wherein FIG. 7A is a cross-sectional view showing a simulation model, FIG. 7B is a diagram showing an equipotential diagram when a withstanding voltage to dielectric breakdown in the cross-sectional of FIG. 7A is applied, and FIG. 7C is a graph showing the current-voltage characteristic;

DETAILED DESCRIPTION OF THE PREFERRED EMBODIMENTS

Figure 2A:
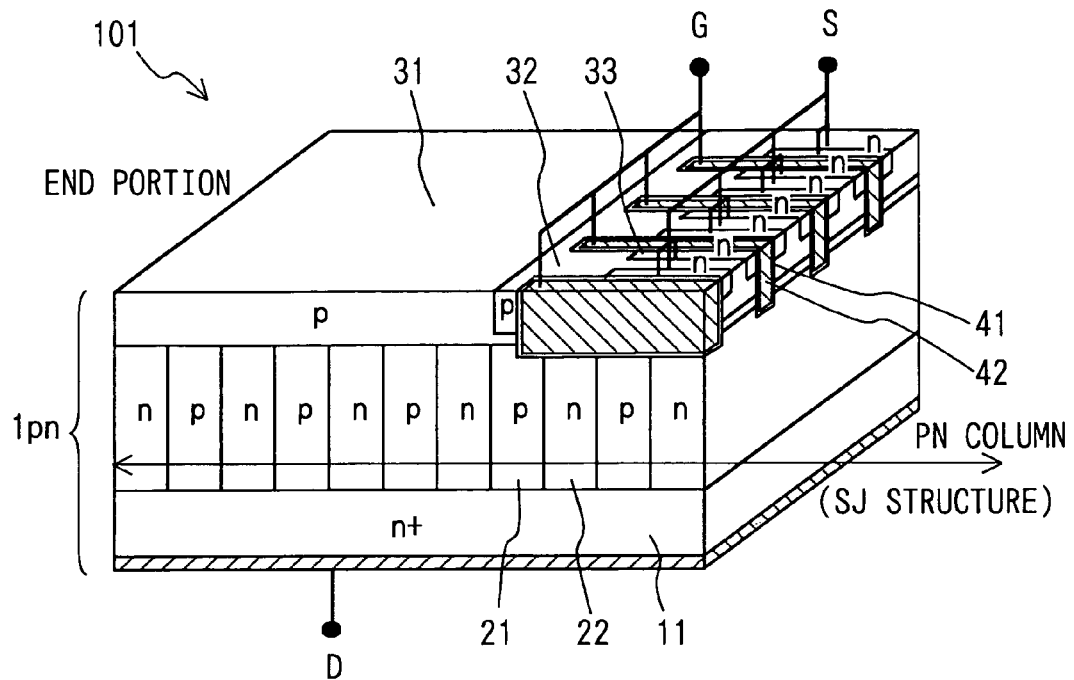
FIGS. 2A and 2B are perspective views showing a vertical MOSFET having a trench gate structure according to a first embodiment of the present invention.

Preferred embodiments according to the present invention will be described hereunder with reference to the accompanying drawings.

The present disclosure concerns a method of manufacturing a semiconductor device (chip) having a pn column for power which has a high withstanding voltage and low ON-resistance and that can also eliminate alignment with the pn column. The present disclosure also concerns a semiconductor substrate and a semiconductor device (chip) manufactured by using the semiconductor substrate according to the semiconductor device manufacturing method. The semiconductor device having the pn column which can be manufactured with no alignment with the pn column can be manufactured by forming the plural semiconductor devices having the same structure in one semiconductor substrate and cutting them (or dicing them) into individual device chips.

The semiconductor device manufacturing method and the semiconductor substrate according to the present invention will be described with reference to FIGS. 1A to 1E. FIG. 1A is a plan view showing a semiconductor substrate 1 according to the present invention, and FIG. 1B is a cross-sectional view of FIG. 1A according to line 1B-1B.

Referring to FIG. 1A, an area indicated by reference sign 1pn and the broken line is an area in the semiconductor substrate 1 in which a pn column is formed. Furthermore, each area surrounded by a heavy solid line is an area occupied by one semiconductor device 100. As shown in FIG. 1B, in the pn column formed area 1pn, p-conduction type regions 21 and n-conduction type regions 22 are alternately arranged in a striped form in the substrate section and in a striped repetitive pattern on the substrate surface.

The repetitive pattern of the p-conduction type region 21 and the n-conduction type region 22 is not limited to the striped pattern. As shown in FIGS. 1C to 1E, the p-conduction type regions 21 and the n-conduction type regions 22 may be arranged in such a pattern that any one type of regions are symmetrically disposed in a dot form while surrounded by the other type of regions. Furthermore, the shape of the dots is not limited to a specific one. In FIG. 1B, the pn column is formed on an $n^+$-conduction type layer 11, and a p-conduction type layer 31 is formed on the pn column. The other portions than the pn column in the $n^+$-conduction type layer 11 and the p-conduction type layer 31 are formed so as to be conformed with the semiconductor device 100 to be formed.

According to the semiconductor device manufacturing method of this invention, a pn column is first formed over the whole area of the semiconductor substrate 1 in which plural semiconductor devices 100 having the same structure will be formed. The pn column will be used as a part of the constituent element of each semiconductor device 100. Thereafter, the residual part of the constituent element of each semiconductor device 100 is formed in the pn column formed area 1pn having the repetitive pattern without carrying out alignment with the pn column. Subsequently, the semiconductor devices 100 thus formed are cut out into chips from the pn column formed area 1pn in which the plural semiconductor devices having the same structure are formed, thereby manufacturing the individual semiconductor device 100.

According to the semiconductor device manufacturing device described above, the alignment step can be eliminated, so that the manufacturing cost of the semiconductor device can be reduced. Furthermore, the plural semiconductor devices 100 having the same structure are formed in an area where the repetitive pattern of the pn column is located, and cut out into chips to thereby manufacture the individual semiconductor devices 100. Accordingly, the individual semiconductor devices 100 thus cut out into chips are manufactured as semiconductor devices each of which has a pn column over the whole surface of the chip thereof.

Next, preferred embodiments of each semiconductor device manufactured by using the manufacturing method and the semiconductor substrate will be described in more detail.

First Embodiment

FIG. 2A is a perspective view showing a vertical MOSFET 101 having an SJ structure according to a first embodiment of the present invention. In the vertical type MOSFET 101 of FIGS. 2A and 2B, the same parts as the respective constituent elements of the conventional vertical type MOSFET 90 shown in FIG. 12 are represented by the same reference numerals.

Figure 12:
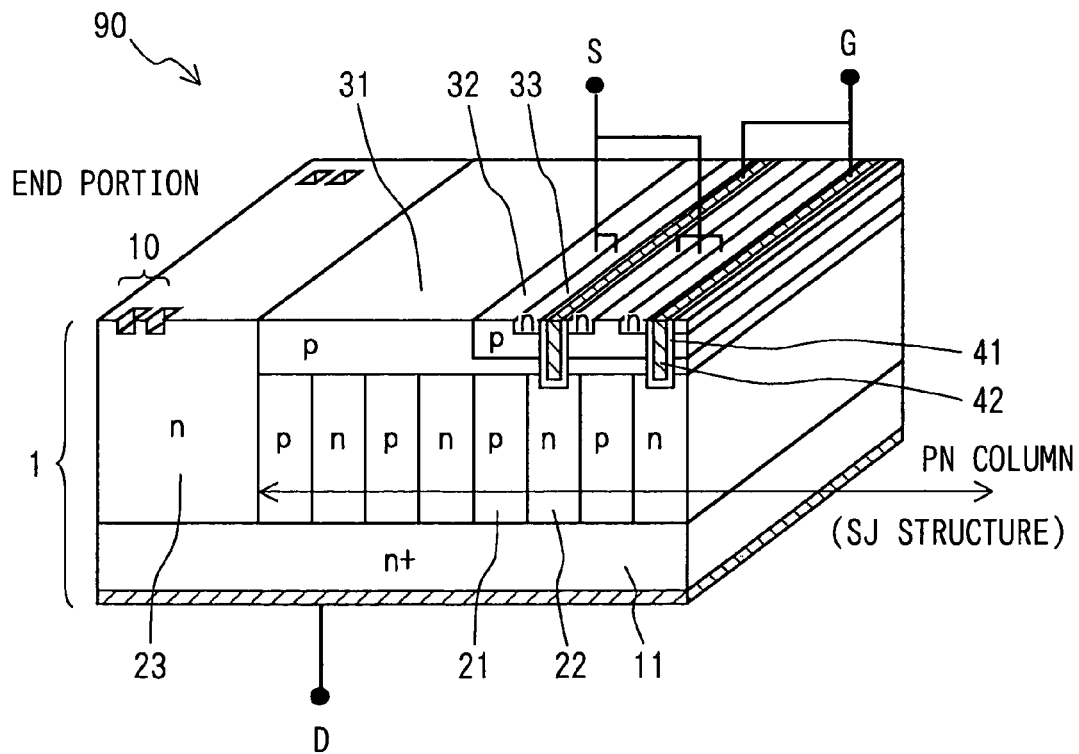
FIG. 12 is a perspective view showing a vertical type MOSFET having a conventional trench gate structure.
Figure 13:
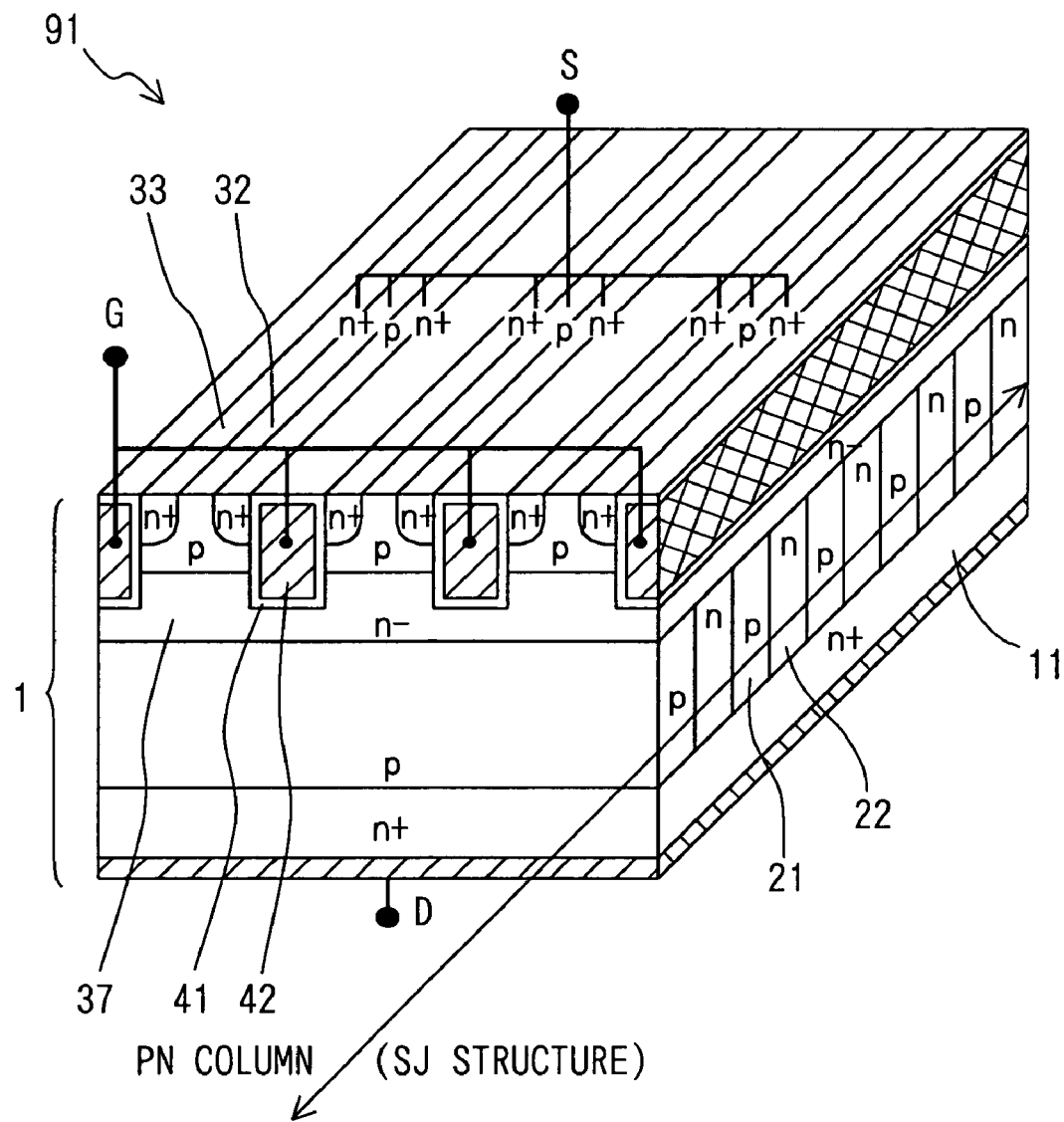
FIG. 13 is a perspective view showing another vertical type MOSFET having a conventional trench gate structure.
Figure 14A:
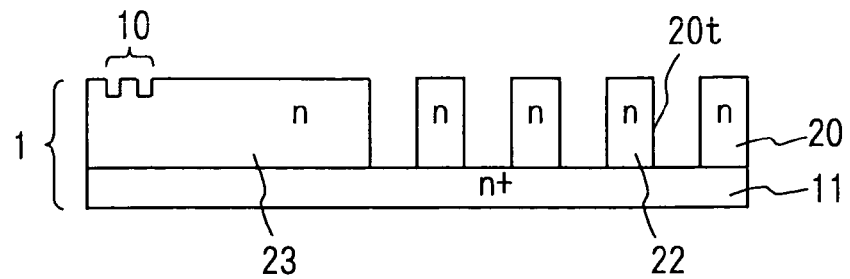
FIGS. 14A to 14D are cross-sectional views showing a related art method of manufacturing a vertical type MOSFET.
Figure 14B:
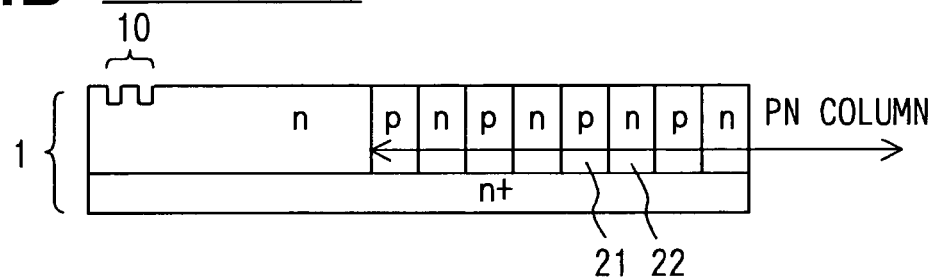
Figure 14C:
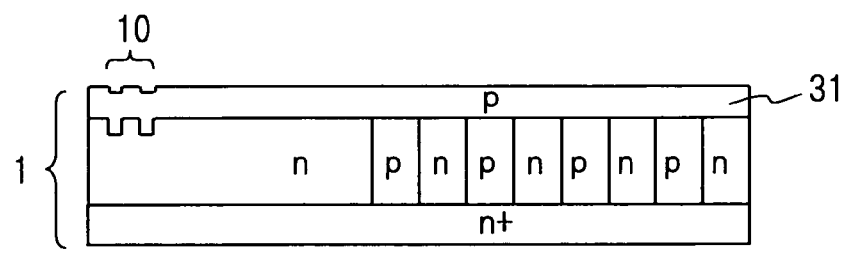
Figure 14D:
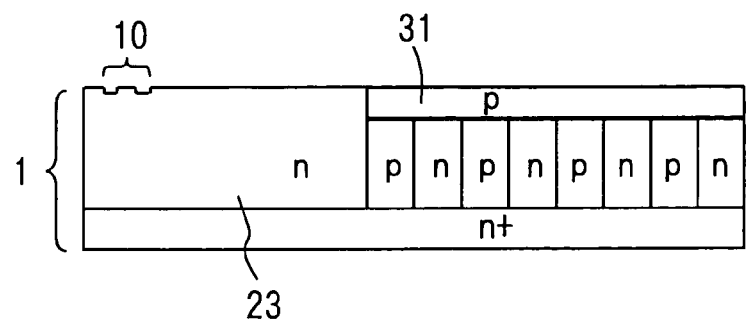
Figure 15A:
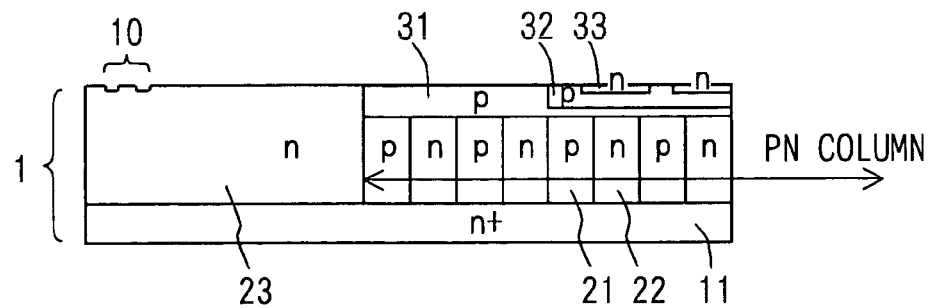
FIGS. 15A to 15C are cross-sectional views showing the related art method of manufacturing the vertical type MOSFET.
Figure 15B:
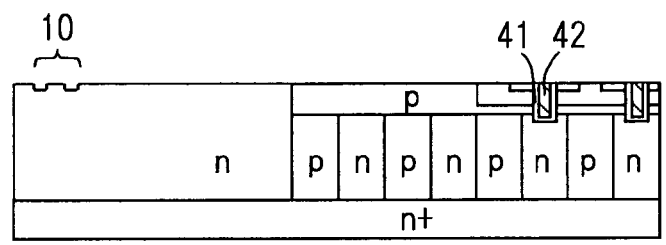
Figure 15C:
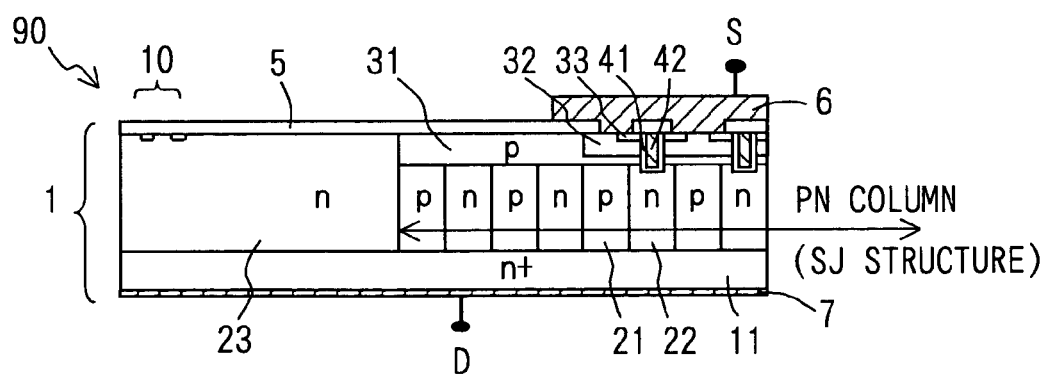

FIG. 2A shows the end portion of the vertical MOSFET like FIG. 12. As in the case of the vertical MOSFET 90 shown in FIG. 12, the pn column on the $n^+$-conduction type layer 11 serving as the drain corresponds to the SJ structure in the vertical type MOSFET 101 shown in FIG. 2A. However, the vertical MOSFET 101 of FIG. 2A is different from the vertical type MOSFET 90 of FIG. 12 in that the pn column comprising the repetitive pattern of the p-conduction type region 21 and the n-conduction type region 22 is formed so as to extend to the end portion of the vertical type MOSFET 101 at the left side of FIG. 2A. This reflects the manufacturing process that the plural semiconductor devices (vertical type MOSFETs 101) are formed in the pn column formed area 1pn of the semiconductor substrate 1 shown in FIG. 1A and diced into chips.

In the vertical MOSFET 90 of FIG. 12, the striped trench gate electrodes 42 are arranged in parallel to the striped pn column. On the other hand, in the vertical type MOSFET 101 shown in FIG. 2A of this embodiment, the striped trench gate electrodes are disposed so as to cross the striped pn column and project into the n-conduction type regions 22 and the p-conduction type regions 21 of the pn column. In FIG. 2A, the stripe of the trench gate electrodes 42 and the stripe of the pn column cross each other. However, the alignment of the trench gate electrodes 42 with the pn column is not carried out, and thus the cross angle may be set to any value. Furthermore, the alignment is not carried out, and thus the alignment key 10 formed in the vertical MOSFET 90 of FIG. 12 is not formed in the vertical MOSFET 101 of FIG. 2A.

FIGS. 3A to 3C and FIGS. 4A to 4C are cross-sectional views showing the method of manufacturing the vertical type MOSFET 101 of FIG. 2A. The cross-sectional views of FIGS. 3A to 3C and FIGS. 4A to 4C show the manufacturing process of the vertical type MOSFET 101 when viewed from the front side of the perspective view of FIG. 2A. The manufacturing process of the vertical type MOSFET 101 shown in FIGS. 3A to 3C and FIGS. 4A to 4C are basically the same as the manufacturing process of the vertical type MOSFET 90 shown in FIGS. 14A to 14D and FIGS. 15A to 15C. FIGS. 3A to 3C and FIGS. 4A to 4C are cross-sectional views showing the steps in the pn column formed area 1*pn* of the semiconductor substrate shown in FIG. 1A.

As in the case of the manufacturing process of the vertical type MOSFET 90 of FIG. 12, the manufacturing process of the vertical type MOSFET 101 of FIG. 2A uses a semiconductor substrate (wafer) 1 in which an n-conduction type layer 20 is formed on an n$^+$-conduction type layer 11.

Figure 3A:
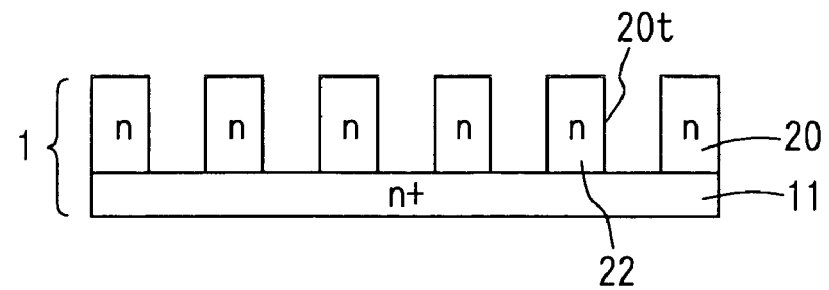
FIGS. 3A to 3C are cross-sectional views showing a method of manufacturing the vertical type MOSFET of FIG. 2A.

First, by using etching, trenches 20*t* are formed in an area where the pn column of the semiconductor substrate 1 of FIG. 1A will be formed as shown in FIG. 3A, whereby the n-conduction type layer 20 of the semiconductor substrate 1 is divided, and n-conduction type regions 22 of the pn column are formed.

Figure 3B:
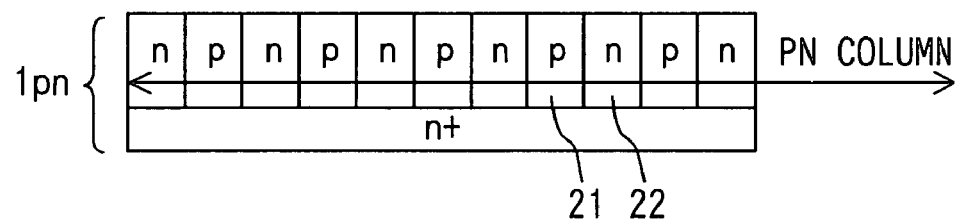

Subsequently, as shown in FIG. 3B, a p-conduction type layer is formed by the epitaxial method so that the trenches 20*t* are filled with the p-conduction type layer, and then the surface of the semiconductor substrate is flattened by a polishing method. Accordingly, the p-conduction type layer embedded in the trenches 20*t* serves as p-conduction type regions 21, whereby the pn column formed area 1*pn* in the semiconductor substrate 1 of FIG. 1A is formed.

Figure 3C:
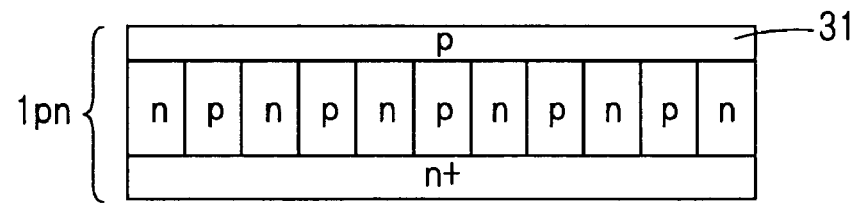

Subsequently, as shown in FIG. 3C, a p-conduction type layer 31 serving as a body layer is formed over the whole surface of the semiconductor substrate 1 of FIG. 1A by the epitaxial method.

Figure 4A:
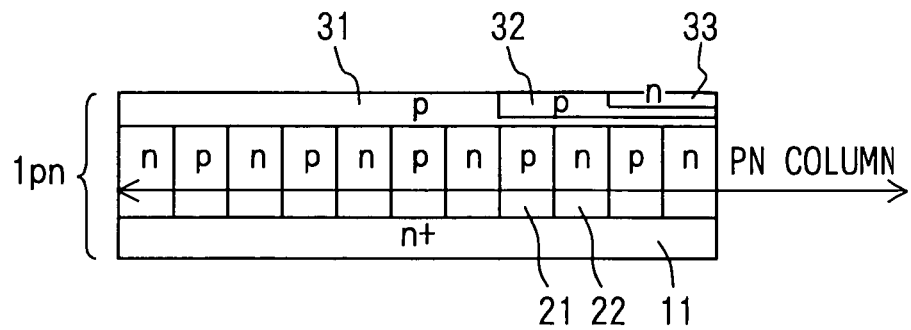
FIGS. 4A to 4C are cross-sectional views showing a method of manufacturing the vertical type MOSFET of FIG. 2A.

Subsequently, as shown in FIG. 4A, a predetermined area of the p-conduction type region 31 is masked, and selective ion-implantation of impurities is carried out to form p-conduction type regions 32 serving as channels and n-conduction type regions 33 serving as sources.

Figure 4B:
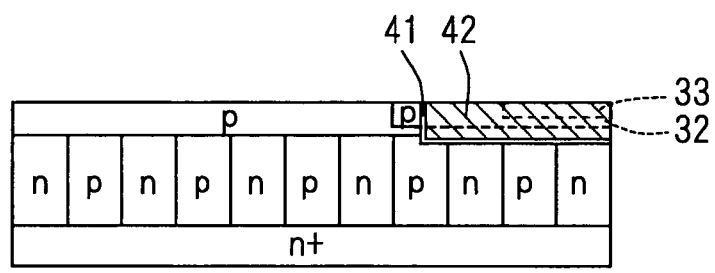

Subsequently, as shown in FIG. 4B, the striped trenches are formed without carrying out precise alignment so that the striped trenches cross the pn column and the tips of the trenches project into the pn column. Thereafter, the trench side walls are oxidized to form gate oxide film 41, and gate electrodes 42 are embedded in the trenches.

Figure 4C:
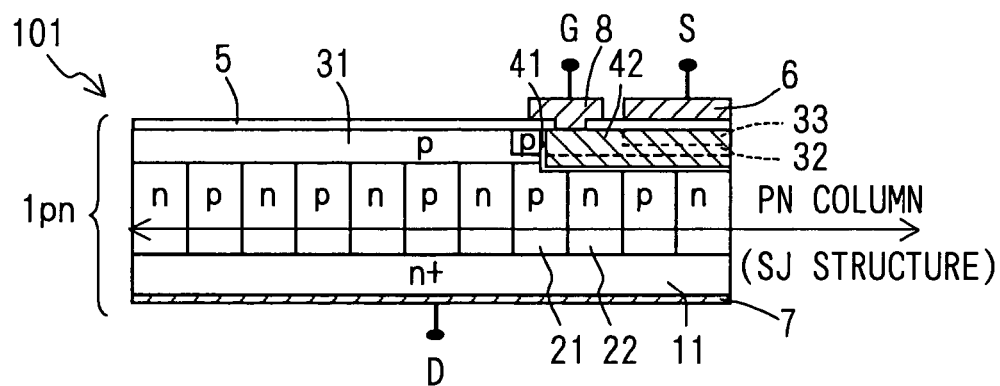

Finally, as shown in FIG. 4C, a source electrode 6 and a gate electrode wire 8 are formed through interlayer insulating film 5, and a drain electrode 7 is formed on the opposite side surface, thereby completing the formation of the vertical type MOSFET 101 shown in FIG. 2A.

In the manufacturing process described above, many vertical type MOSFETs 101 having the same structure shown in FIG. 2A are formed in the pn column formed area 1*pn* of one semiconductor substrate (wafer) shown in FIG. 1A, and finally these vertical type MOSFETs 101 are cut out into individual chips, whereby the vertical type MOSFETs 101 shown in FIG. 2A are individually manufactured.

With respect to the vertical type MOSFET 101 shown in FIG. 2A, the pn column can be used as the SJ structure like the vertical type MOSFET 90 shown in FIG. 12. By increasing the impurity concentration of the n-conduction type regions 22 serving as the drift layers to reduce the ON-resistance and also depleting the pn column completely under the off state, the vertical type MOSFET 101 of FIG. 2A can be designed to have low ON-resistance and a desired withstanding voltage. In order to achieve the above characteristic, the striped pn column and the trench gate electrodes 42 are not necessarily required to cross each other, and also the pn column and the trench gate electrodes 42 are not necessarily required to be designed in a stripe shape. Any structure may be adopted insofar as electrons flowing out from the n-conduction type region 33 serving as the source pass through the channels formed in the p-conduction type region 32, the p-conduction type layer 31 and the p-conduction type regions 21 around the trench gate electrodes 42 and flow into the n-conduction areas 22 serving as the drift areas.

Figure 5A:
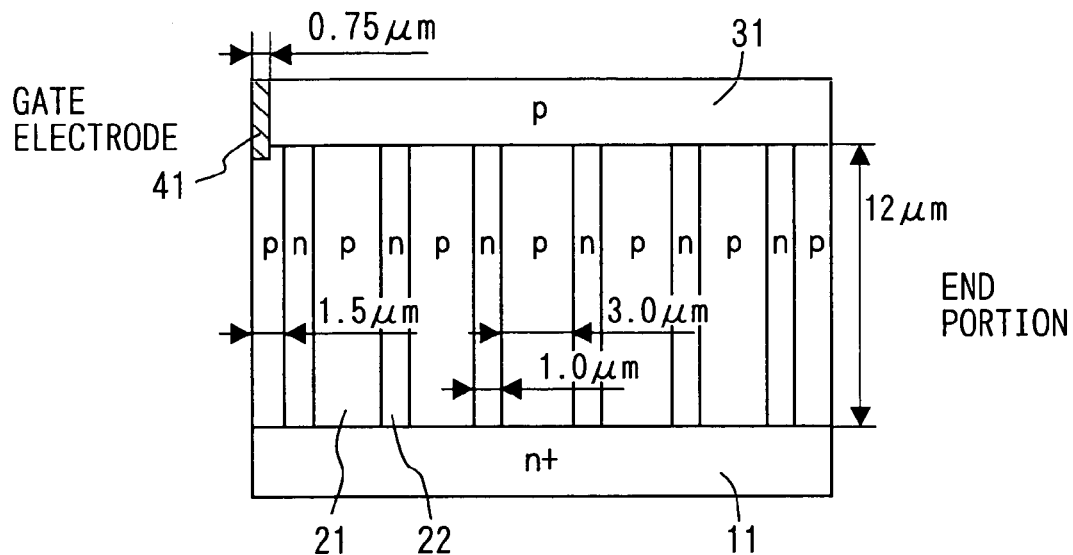
Figure 5B:
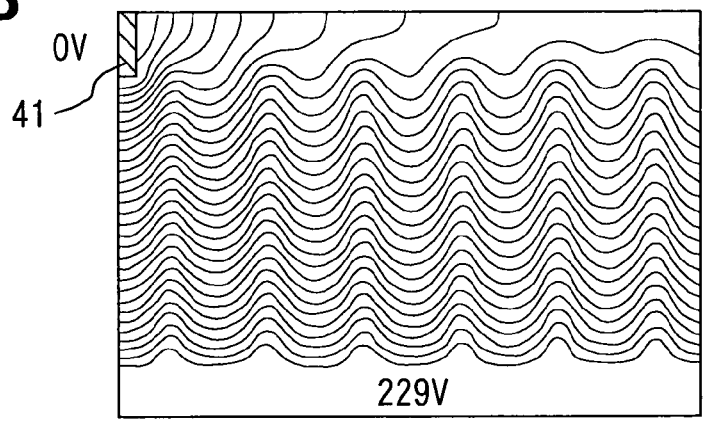
Figure 5C:
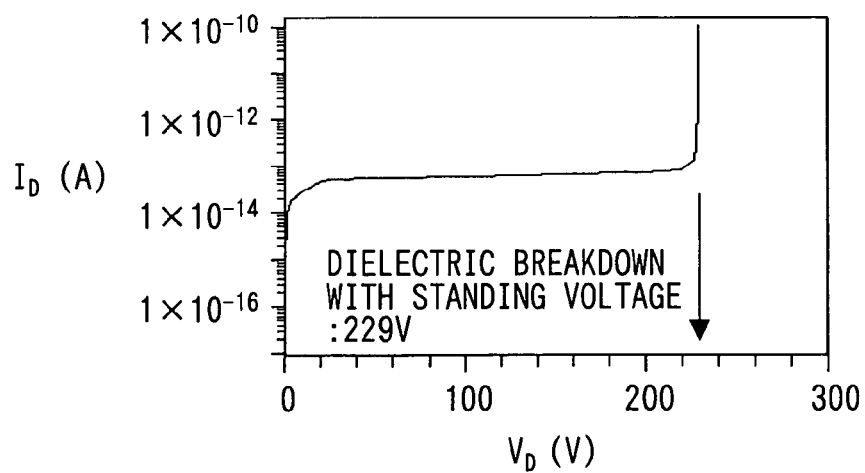
Figure 6A:
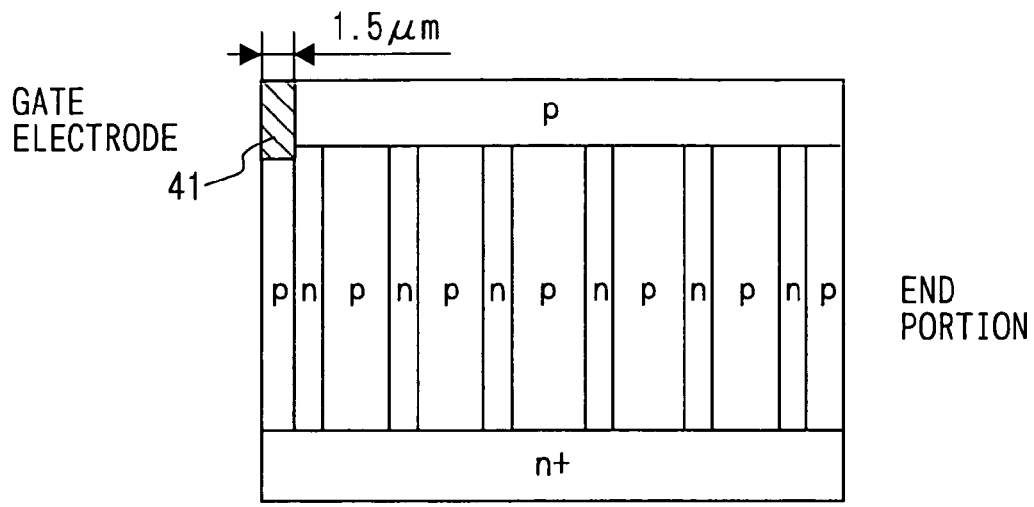
Figure 6B:
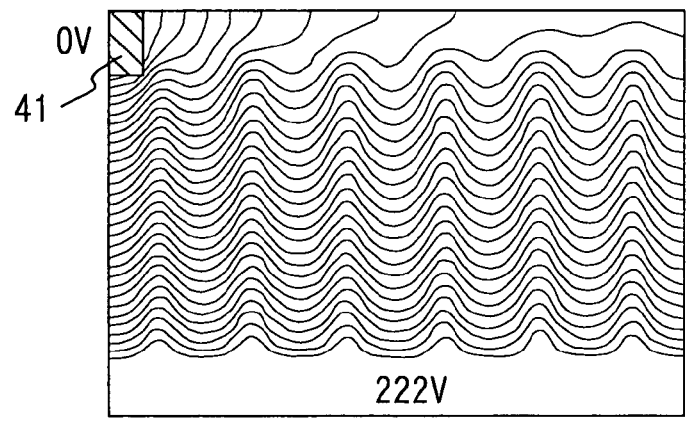
Figure 6C:
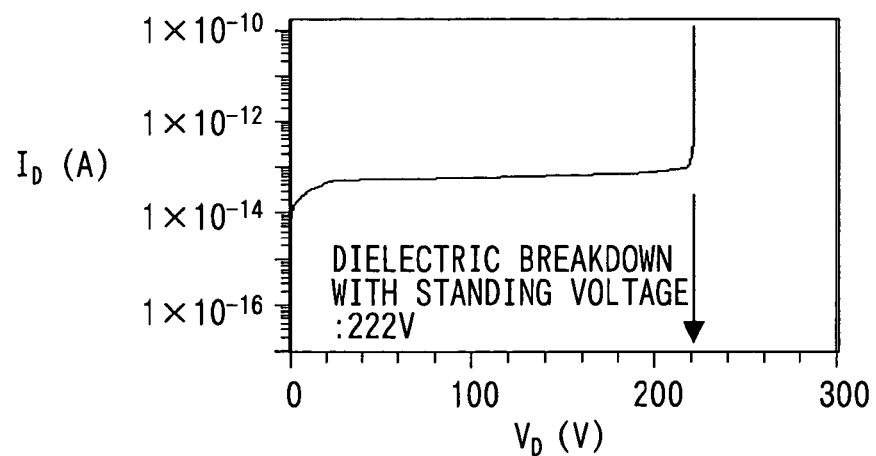
FIG. 6C is a graph showing the current-voltage characteristic.
Figure 7A:
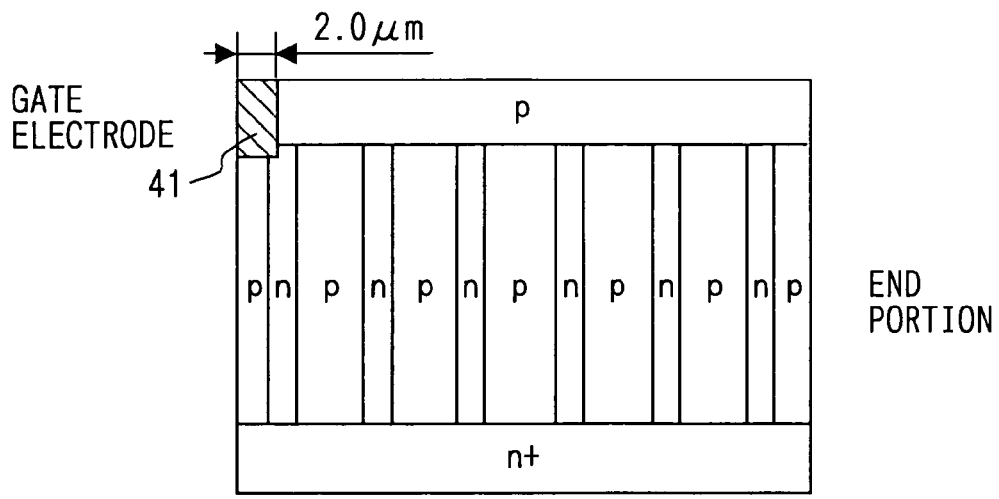
Figure 7B:
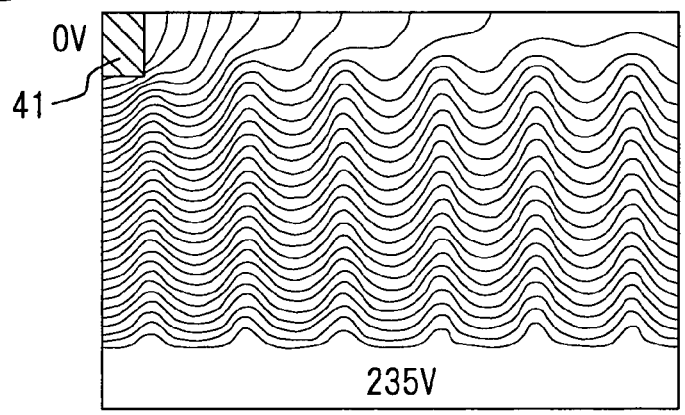

FIGS. 5A to 5C, FIGS. 6A to 6C and FIGS. 7A to 7C show simulation results of the withstanding voltage characteristic under the off state for the vertical type MOSFET having the same structure as shown in FIG. 2A. FIGS. 5A, 6A and 7A are cross-sectional views showing simulation models, FIGS. 5B, 6B and 7B are equipotential diagrams when a dielectric breakdown withstanding voltage is applied in the cross-section of each of FIGS. 5A, 6A and 7A, and FIGS. 5C, 6C and 7C show the current-voltage ($I_D$-$V_D$) characteristic. In FIGS. 5A, 5B, 6A, 6B, 7A, 7B, the end portion of the vertical type MOSFET is located at the right sides of these figures contrarily to FIG. 2A. The simulation models shown in FIGS. 5A, 6A, 7A have the same pn column, but are different from one another in only the tip position of each trench gage electrode 41. Each size of the pn column is set as shown in FIG. 5A. The impurity concentration of the p-conduction type region 21 is set to $1.0 \times 10^{16}$/cm$^3$, the impurity concentration of the n-conduction type region 22 is set to $3.0 \times 10^{16}$/cm$^3$, the impurity concentration of the n$^+$-conduction type layer 11 is set to $1.0 \times 10^{19}$/cm$^3$, and the impurity concentration of the p-conduction type layer 31 is set to $3.0 \times 10^{15}$/cm$^3$.

Figure 7C:
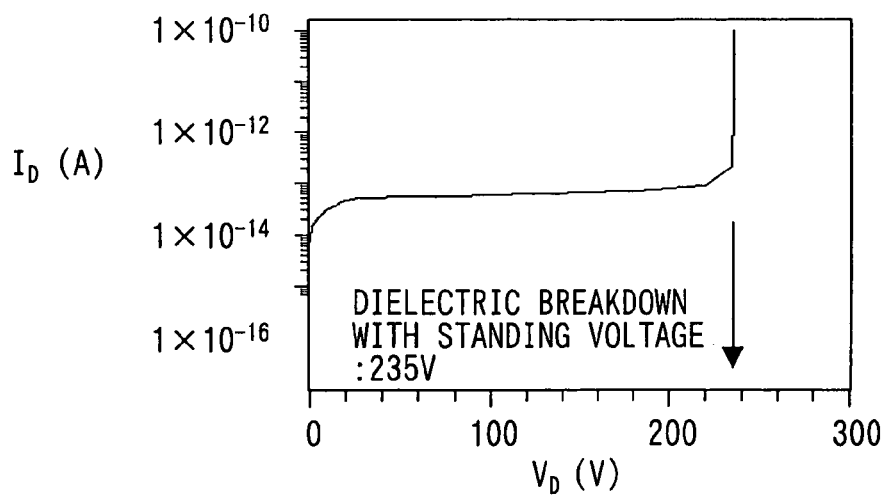

FIGS. 5A to 5C correspond to a case where the tip of each of the trench gate electrodes 41 is located within each of the p-conduction type regions 21, and a dielectric breakdown withstanding voltage of 229V was achieved. FIGS. 6A to 6C correspond to a case where the tip of each trench gate electrode 41 is located at the interface between the p-conduction type region 21 and the n-conduction type region 22, and a dielectric breakdown withstanding voltage of 222V was achieved. FIGS. 7A to 7C correspond to a case where the tip of each trench gate electrode 41 is located within each n-conduction type region 22, and a dielectric breakdown withstanding voltage of 235V was achieved. As is apparent from the simulation results shown in FIGS. 5A to 7C, in the vertical type MOSFET having the same structure as FIG. 2A, the depletion of the pn column is not affected irrespective of the locating position of each trench gate 41 because no alignment is carried out, and substantially equal withstanding voltage can be achieved.

As described above, even a vertical type MOSFET having the structure shown in FIG. 2A which is manufactured at low cost because no alignment is carried out can be brought with a high withstanding voltage and low ON-resistance.

Figure 2B:
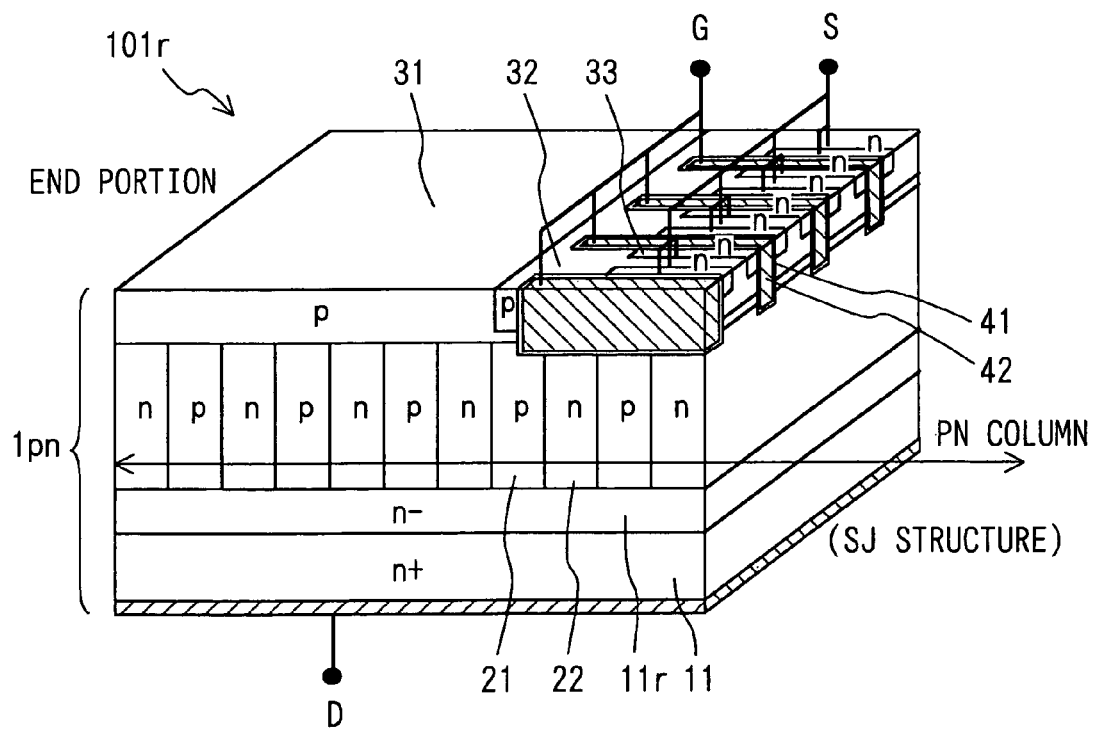

The vertical type MOSFET 101 shown in FIG. 2A is a vertical type MOSFET in which the pn column is formed on the n$^+$-conduction type layer 11 serving as the drain, however, it may be a vertical type MOSFET in which the pn column is formed on two layers of n$^+$-conduction type layer 11/n$^-$-conduction type layer 11*r* like a vertical type MOSFET 101*r* of FIG. 2B.

Figure 8:
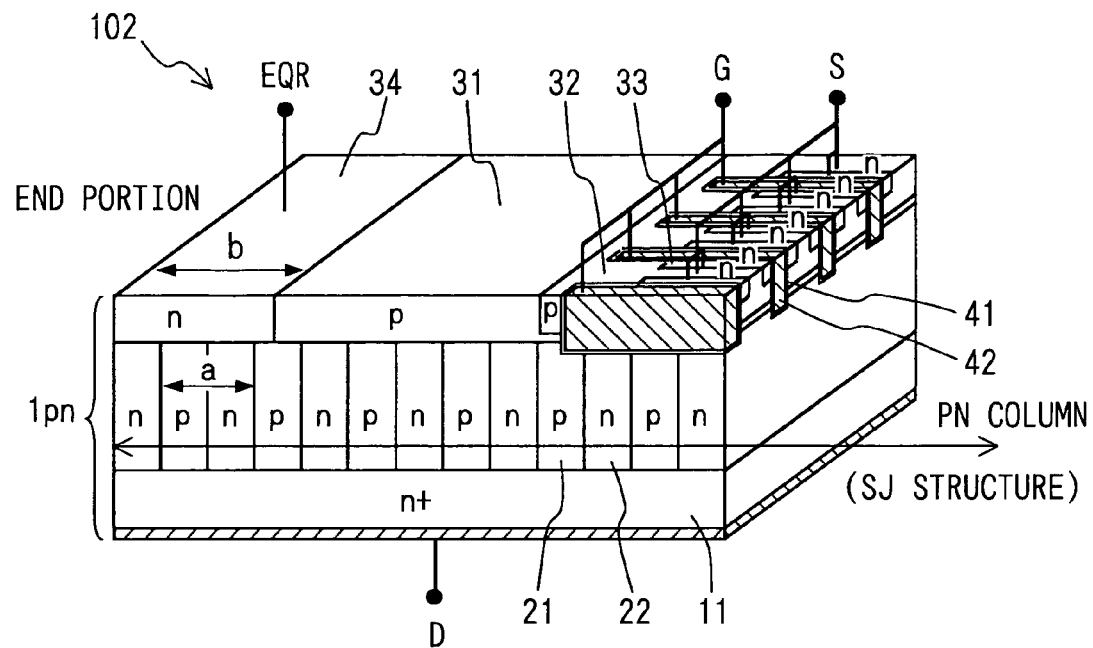
FIG. 8 is a perspective view showing a vertical type MOSFET having EQR formed therein according to another example of the first embodiment.

FIG. 8 is a perspective view showing another example of the vertical type MOSFET. In the vertical MOSFET 102 of FIG. 8, an n-conduction type equipotential ring (EQR) surrounding the pn column is additionally formed in the vertical type MOSFET 101 of FIG. 2A. In the vertical type MOSFET 102 of FIG. 8, the ring width b of the equipotential ring 34 is set to be larger than the repetitive width a of the pn column.

The equipotential ring 34 is formed by masking a predetermined area of the p-conduction type layer 31 and ion-implanting n-type impurities after the step of FIG. 3C. Since the width b of the equipotential ring 34 is set to be larger than the repetitive width a of the pn column as described above, the equipotential ring 34 which is effective to enhance the reliability can be formed with no precise alignment. Accordingly, the vertical MOSFET 102 of FIG. 8 can be also designed as a vertical type MOSFET having a high withstanding voltage and low ON-resistance which can be manufactured at low cost with no alignment.

Figure 9A:
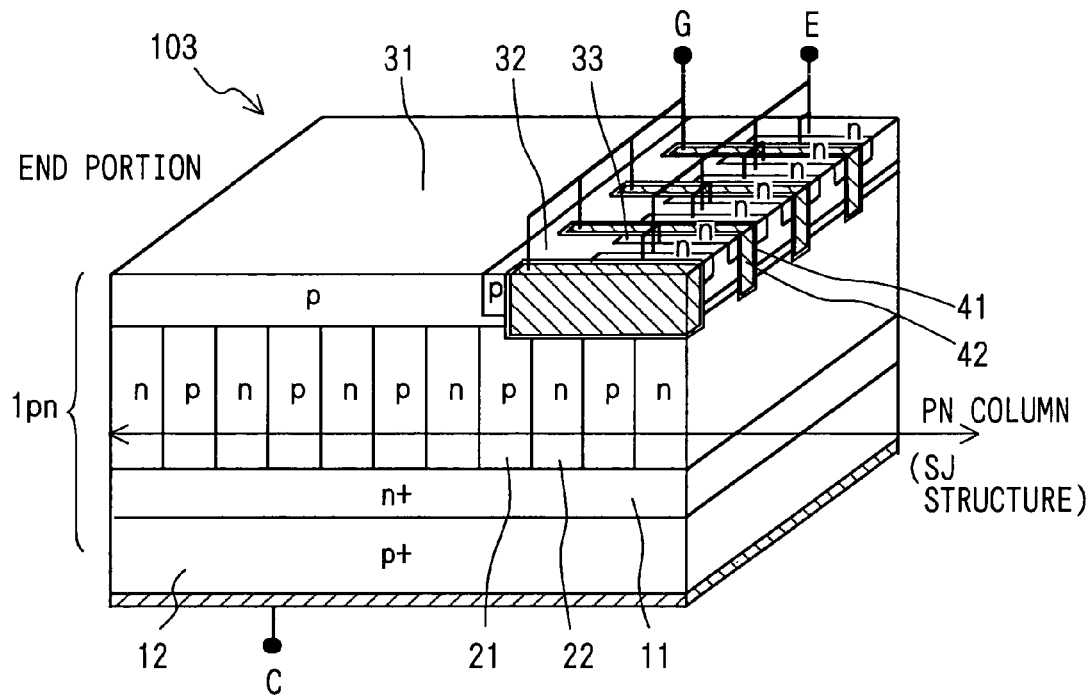
FIGS. 9A and 9B are perspective views showing IGBT according to another examples of the first embodiment.
Figure 9B:
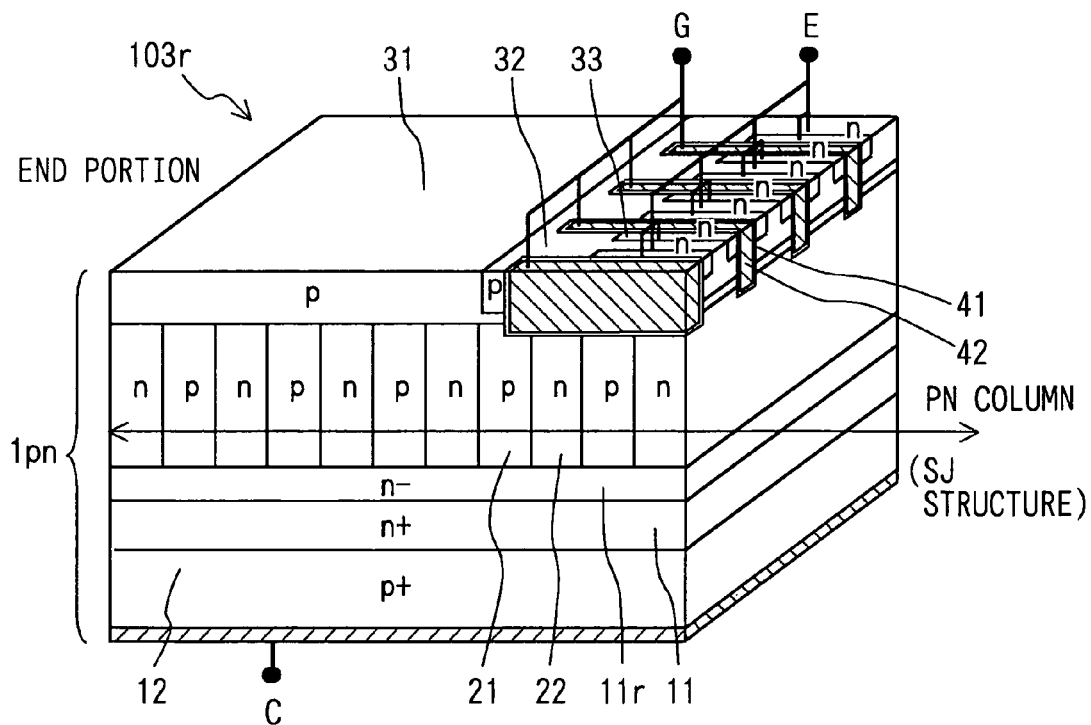

FIG. 9A is a perspective view showing IGBT. IGBT 103 of FIG. 9A is structurally the same as the vertical type MOSFET 101 of FIG. 2A except that a P$^+$-conduction type layer is equipped at the back surface side of the semiconductor substrate. IGBT 103 of FIG. 9A can be manufactured by using a semiconductor substrate (wafer) 1 having a p$^+$-conduction type layer 12, an n$^+$-conduction type layer 11 and an n-conduction type layer 20 formed therein at the start time of the manufacturing process and then carrying out the same processing as the manufacturing process for the vertical type MOSFET 101 shown in FIGS. 3A to 4C. Accordingly, IGBT 103 of FIG. 9A can be designed as IGBT having a high withstanding voltage and low ON-resistance which can be manufactured at low cost with no alignment.

IGBT 103 of FIG. 9A is IGBT in which the pn column is formed on two layers of p$^+$-conduction type layer 12/n$^+$-conduction type layer 11, however, it may be IGBT in which the pn column is formed on three layers of p$^+$-conduction type layer 12/n$^+$-conduction type layer 11/n$^-$-conduction type layer 11r.

Second Embodiment

In the first embodiment, the vertical MOSFET and IGBT having the trench gate structure are described as the semiconductor device formed from the semiconductor substrate of FIG. 1. In this embodiment, a vertical type MOSFET having a planar gate structure is formed from the semiconductor substrate of FIG. 1.

Figure 10:
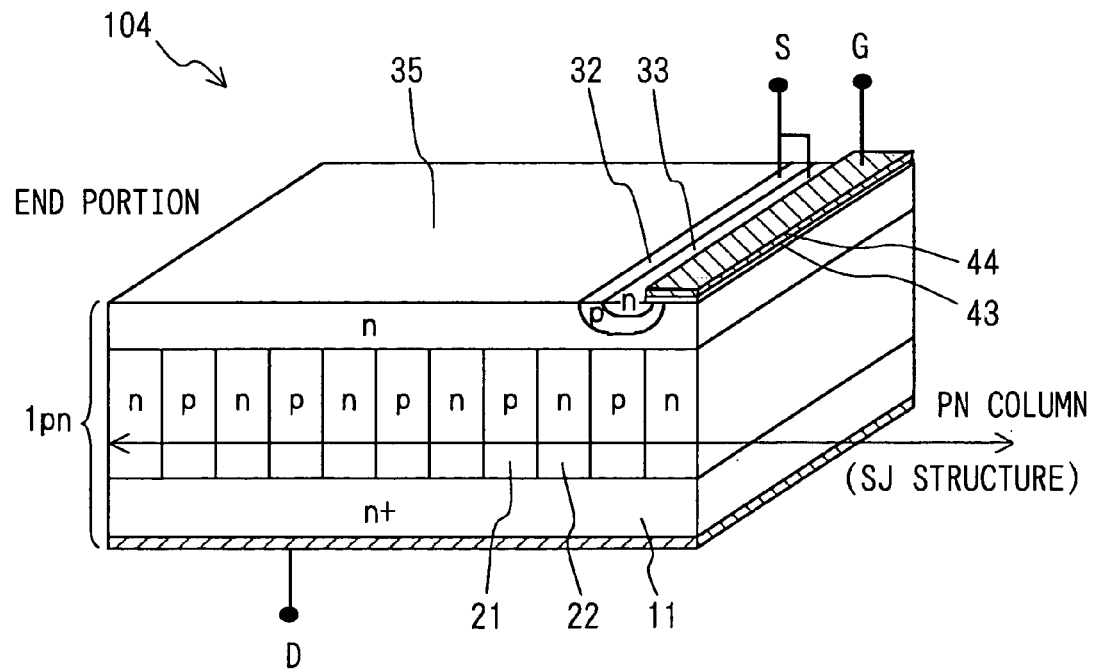
FIG. 10 is a perspective view showing a vertical type MOSFET having a planar gate structure according to a second embodiment.

FIG. 10 is a perspective view showing a vertical MOSFET 104 having a planar gate structure according to the second embodiment. In the vertical MOSFET 104 of FIG. 10, an n-conduction type layer 35 serving as a body layer is formed on a pn column, and a p-conduction type region 32 serving as a channel and an n-conduction type region 33 serving as a source are formed in the n-conduction type layer 35. Furthermore, gate oxide film 43 and a planar gate electrode 44 are formed on the n-conduction type layer 35 serving as the body layer.

In the vertical MOSFET 104 of FIG. 10, the p-conduction type region 32 serving as the channel, the n-conduction type region 33 serving as the source and the gate electrode 44 are formed in a stripe form, however, the shapes thereof may be arbitrary. Any shape may be adopted insofar as electrons flowing out from the n-conduction type region 33 serving as the source pass through the channel formed in the p-conduction type region 32 below the gate electrode 44 and then flow into the n-conduction type layer 35 of the body layer serving as the drift area and the n-conduction type regions 22 of the pn column. As described above, with respect to the vertical type MOSFET 104 having the planar gate structure of FIG. 10, the alignment of the p-conduction type region 32, the n-conduction type region 33 and the gate electrode 44 with the pn column can be eliminated. Furthermore, this embodiment is the same as the first embodiment in that the pn column serves as an SJ structure, and the pn column is perfectly depleted under the off state, thereby increasing the withstanding voltage. Accordingly, the vertical MOSFET 104 of FIG. 10 can be designed as a vertical MOSFET having a high withstanding voltage and low ON-resistance which is manufactured at low cost with no alignment.

Third Embodiment

In the first and second embodiments, the vertical type MOSFET and IGBT are described as a semiconductor device formed from the semiconductor substrate of FIG. 1. In this embodiment, a diode formed from the semiconductor substrate of FIG. 1 will be described.

Figure 11:
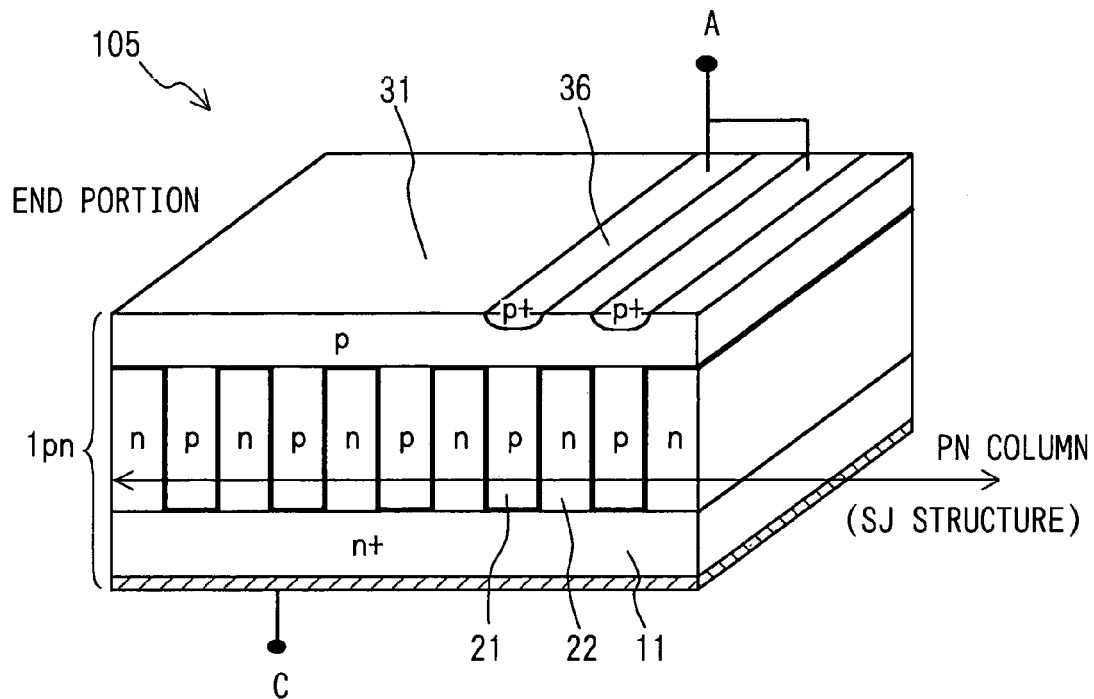
FIG. 11 is a perspective view showing a diode according to a third embodiment.

FIG. 11 is a perspective view showing a diode 105 according to this embodiment. In the diode 105 of FIG. 11, p$^+$-conduction type regions 36 to which an anode electrode is connected are formed in the p-conduction type layer 31 on the pn column. In the diode 105 of FIG. 11, portions indicated by heavy lines in FIG. 11 correspond to PN junctions.

In the diode 105 shown in FIG. 11, the pn column corresponds to the SJ structure, and the pn column is perfectly depleted when a reverse voltage is applied, so that a diode having a high withstanding voltage can be achieved. Furthermore, when diodes of the diode 105 of FIG. 11 are formed, the diode 105 is cut out by a predetermined size without carrying out alignment, and diodes each having a desired characteristic can be manufactured. Accordingly, the diode 105 of FIG. 11 can be designed as a diode having a high withstanding voltage which is manufactured at low cost with no alignment.

Other Embodiment

Each of the vertical type MOSFETs 101, 101r, 102, 104 shown in FIGS. 2A and 2B, FIG. 8 and FIG. 10 is an n-channel vertical type MOSFET. However, the present invention is not limited to this mode, and it may be a p-type vertical MOSFET. In this case, all the conduction types of the vertical MOSFET in FIGS. 2A and 2B, FIG. 8 and FIG. 10 are reversed.

Furthermore, according to this embodiment, the vertical type MOSFET has the trench gate structure, however, the vertical type MOSFET may have a concave gate structure.

As described above, according to the present invention, the semiconductor device is designed so that the direction of the repetitive pattern of the PN column and the extending direction of each trench gate cross each other, so that the alignment-free semiconductor device can be more easily achieved. That is, dispersion can be prevented from concentrating on a specific cell, in other words, dispersion can be uniformly deconcentrated over each chip and over wafer.

Therefore, the present disclosure concerns a method for forming a plurality of semiconductor devices 100 having the same structure on one semiconductor substrate 1 and dicing the plurality of semiconductor devices 100 into a plurality of semiconductor device chips 101, 102, 103, 104, 105. In this method, first a pn column is formed in the semiconductor substrate 1. The pn column has a strip form within the semiconductor substrate 1 and has a repetitive pattern of a p-conduction type 21 and an n-conduction type 22 on a substrate surface over an area where the plurality of semiconductor devices 100 having the same structure is to be formed. Next residual constituent elements 32, 33, 36 of the plurality of semiconductor devices 100 having the same structure are formed in areas where the repetitive patterns are located. The pn column serves as a constituent element of each of the plurality of semiconductor devices 100. The plurality of semiconductor devices 100 is then diced into the plurality of semiconductor device chips 101, 102, 103, 104, 105 from the area where the plurality of semiconductor devices 100 having the same structure is formed.

The repetitive pattern may have a striped pattern or a symmetrical dot pattern.

The present disclosure also concerns a semiconductor device chip 101, 102, 103, 104, 105 achieved by forming a plurality of semiconductor devices 100 having the same structure in one semiconductor substrate 1 and dicing the plurality of semiconductor devices 100 into individual device chips as discussed above. The semiconductor device chip 101, 102, 103, 104, 105 includes a pn column having a strip form in a section of the semiconductor substrate 1 and a repetitive pattern of a p-conduction type 21 and an n-conduction type 22 on a substrate surface. The pn column serving as a part of a constituent element of the semiconductor device chip 101, 102, 103, 104, 105. The chip also includes a residual part of the constituent element formed in an area where the repetitive pattern of the pn column is located. The individual device chips are diced from the area where the plurality of semiconductor devices 100 having the same structure are formed.

The semiconductor device chip may be a vertical type MOSFET 101, 102, 104 having a pn column as a super junction structure or an IGBT 103 having a pn column as a super junction structure in which the gate structure of the semiconductor device chip is a trench gate structure 42. Also, the trench gate structure may be formed so as to project into the pn column and trench gates and the repetitive pattern may be designed to be in a stripe form, wherein a stripe of the trench gate array and a stripe of the repetitive pattern are disposed to cross each other. Also, the trench gate structure may have trench wall surfaces which extend so as to cross the pn column.

Also, the gate structure of the semiconductor device chip may be a planar gate structure or a concave gate structure.

The semiconductor device chip is a diode 105 in which the pn column serves as a pn junction portion.

Also, the semiconductor device chip 102 may include an equipotential ring 34 surrounding the semiconductor device chip 102 on the pn column. In such a case, a ring width of the equipotential ring 34 is set to be larger than a repetitive width of the repetitive pattern.

What is claimed is:

1. A semiconductor substrate in which a plurality of semiconductor devices having the same structure are formed, wherein the semiconductor substrate is diced into a plurality of semiconductor device chips, the semiconductor substrate comprising a pn column formed over a predetermined pn column area within which the plurality of semiconductor devices having the same structure are formed so that the pn column has a strip shape in a section of the substrate and also has a repetitive pattern of a p-conduction type material and an n-conduction type material on a substrate surface, wherein the predetermined pn column area is larger than the total area of the plurality of semiconductor devices to be formed.

2. The semiconductor substrate according to claim 1, wherein the repetitive pattern is a striped pattern.

3. The semiconductor substrate according to claim 1, wherein the repetitive pattern is a symmetrical dot pattern.

4. A semiconductor substrate on which a plurality of semiconductor devices having the same structure are formed, wherein the substrate is adapted to be diced to separate the semiconductor devices, the substrate comprising:
   a pn column area having a strip form and a repetitive pattern of a p-conduction type material and an n-conduction type material on a surface of the substrate, the pn column area serving to form parts of the semiconductor devices; and
   device areas that correspond to the devices, wherein the device areas are located within the pn column area, and wherein the pn column area is larger than the total area of the device areas, such that part of the pn column area remains outside of the device areas.

5. The semiconductor substrate according to claim 4, wherein the repetitive pattern is a striped pattern.

6. The semiconductor substrate according to claim 4, wherein the repetitive pattern is a symmetrical dot pattern.

7. The semiconductor substrate according to claim 4, wherein each semiconductor device is a vertical type MOSFET having a pn column as a super junction structure.

8. The semiconductor substrate according to claim 7, wherein a gate structure of each semiconductor device is a trench gate structure.

9. The semiconductor substrate according to claim 8, wherein trench gates of the trench gate structure are formed so as to project into the pn column.

10. The semiconductor substrate according to claim 8, wherein the trench gates and the repetitive pattern are designed to be in a stripe form, wherein a stripe of the trench gate array and a stripe of the repetitive pattern are disposed to cross each other.

11. The semiconductor substrate according to claim 8, wherein a trench gate structure has trench wall surfaces which extend so as to cross the pn column.

12. The semiconductor substrate according to claim 7, wherein a gate structure of each semiconductor device is a planar gate structure.

13. The semiconductor substrate according to claim 4, wherein each semiconductor device is an IGBT having a pn column as a super junction structure.

14. The semiconductor substrate according to claim 13, wherein a gate structure of each semiconductor device is a trench gate structure.

15. The semiconductor substrate according to claim 13, wherein a gate structure of each semiconductor device is a planar gate structure.

16. The semiconductor substrate according to claim 4, wherein each semiconductor device is a diode in which the pn column serves as a pn junction portion.

17. The semiconductor substrate according to claim 4, further comprising an equipotential ring surrounding each semiconductor device on the pn column, wherein a ring width of the equipotential ring is set to be larger than a repetitive width of the repetitive pattern.

18. The semiconductor substrate according to claim 4, wherein the repetitive pattern of the pn column extends over the entire area of each device.

* * * * *